United States Patent
Lai et al.

(10) Patent No.: US 10,972,098 B2
(45) Date of Patent: Apr. 6, 2021

(54) TUNABLE DEVICE INCLUDING TUNABLE MEMBER RESPONSIBLE TO ELECTRIC FIELD APPLIED THERETO, TRANSDUCER INCLUDING THE TUNABLE DEVICE, AND METHOD OF CHANGING ONE OF STIFFNESS AND DAMPING COEFFICIENT OF TUNING THE TUNABLE DEVICE

(71) Applicant: NATIONAL TSING HUA UNIVERSITY, Hsinchu (TW)

(72) Inventors: Wei-Cheng Lai, Taipei (TW); Wei-Leun Fang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 16/412,659

(22) Filed: May 15, 2019

(65) Prior Publication Data
US 2019/0265114 A1 Aug. 29, 2019

Related U.S. Application Data

(63) Continuation-in-part of application No. 15/130,476, filed on Apr. 15, 2016, now abandoned.

(51) Int. Cl.
| | |
|---|---|
| H03K 17/96 | (2006.01) |
| G01D 18/00 | (2006.01) |
| G01L 1/14 | (2006.01) |
| G01L 25/00 | (2006.01) |
| G01P 15/08 | (2006.01) |
| G01P 21/00 | (2006.01) |
| H04R 19/02 | (2006.01) |

(52) U.S. Cl.
CPC ........... *H03K 17/962* (2013.01); *G01D 18/00* (2013.01); *G01L 1/142* (2013.01); *G01L 1/148* (2013.01); *G01L 25/00* (2013.01); *G01P 15/0802* (2013.01); *G01P 21/00* (2013.01); *H04R 19/02* (2013.01); *H04R 2201/003* (2013.01)

(58) Field of Classification Search
CPC ...... H03K 17/962; G01D 18/00; G01L 1/148; G01L 25/00; G01L 1/142; G01P 15/0802; G01P 21/00; H04R 19/02; H04R 2201/003
See application file for complete search history.

(56) References Cited

U.S. PATENT DOCUMENTS

| | | | |
|---|---|---|---|
| 7,868,778 B2 | 1/2011 | Kenwright | |
| 8,933,895 B2 * | 1/2015 | Nakanishi | G06F 3/0412 345/173 |
| 10,071,902 B2 * | 9/2018 | Buchanan | G01N 29/022 |
| 10,152,933 B2 * | 12/2018 | Kuo | G09G 3/3655 |

(Continued)

FOREIGN PATENT DOCUMENTS

| | | |
|---|---|---|
| CN | 101059380 A | 10/2001 |
| TW | 201145770 A1 | 12/2011 |

*Primary Examiner* — Sejoon Ahn
(74) *Attorney, Agent, or Firm* — Birch, Stewart, Kolasch & Birch, LLP

(57) ABSTRACT

A tunable device includes a deformable dielectric unit formed with a receiving space, and a tunable member received in the receiving space and responsible to an electric field applied to the tunable member. A transducer is also provided, and includes at least one of the tunable device and one of a driver unit, a sensing unit and the combination thereof in signal transmission with the tunable device. A method of tuning the tunable device is also provided.

9 Claims, 11 Drawing Sheets

(56) References Cited

U.S. PATENT DOCUMENTS

| | | |
|---|---|---|
| 2002/0101646 A1 | 8/2002 | Ide et al. |
| 2003/0234769 A1 | 12/2003 | Cross et al. |
| 2008/0150888 A1* | 6/2008 | Albert ............... G06F 3/03545 345/107 |
| 2008/0165139 A1* | 7/2008 | Hotelling ............ G06F 3/045 345/173 |
| 2008/0218648 A1 | 9/2008 | Koshihara et al. |
| 2009/0084612 A1 | 4/2009 | Mattice et al. |
| 2009/0167721 A1* | 7/2009 | Hamm ................ G06F 3/044 345/174 |
| 2009/0202891 A1 | 8/2009 | Morganstein |
| 2010/0141407 A1 | 6/2010 | Heubel et al. |
| 2010/0265192 A1 | 10/2010 | Lee |
| 2011/0007377 A1 | 1/2011 | Selbrede et al. |
| 2011/0079501 A1 | 4/2011 | Arai |
| 2011/0095975 A1 | 4/2011 | Hwang et al. |
| 2011/0096025 A1 | 4/2011 | Slobodin et al. |
| 2011/0109588 A1* | 5/2011 | Makinen ............. G09B 21/003 345/174 |
| 2011/0122097 A1* | 5/2011 | Tsang ................. G06F 3/0428 345/175 |
| 2011/0148793 A1 | 6/2011 | Ciesla et al. |
| 2011/0227862 A1* | 9/2011 | Lim ..................... G06F 3/044 345/174 |
| 2011/0279130 A1* | 11/2011 | Reccius ............. G01N 15/1056 324/649 |
| 2012/0017703 A1 | 1/2012 | Ikebe et al. |
| 2012/0062510 A1 | 3/2012 | Mo et al. |
| 2012/0127122 A1 | 5/2012 | Lim |
| 2012/0262410 A1 | 10/2012 | Lim |
| 2013/0063393 A1* | 3/2013 | Kurishima ............ B32B 7/02 345/174 |
| 2013/0172052 A1* | 7/2013 | Bengtsson ........... G06F 3/0416 455/566 |
| 2013/0241860 A1 | 9/2013 | Ciesia et al. |
| 2013/0337233 A1* | 12/2013 | Chen ..................... C03C 17/00 428/161 |
| 2014/0028926 A1 | 1/2014 | Jiang et al. |
| 2014/0118279 A1 | 5/2014 | Ding et al. |
| 2014/0160063 A1 | 6/2014 | Yairi et al. |
| 2014/0160064 A1 | 6/2014 | Yairi et al. |
| 2014/0320431 A1 | 10/2014 | Cruz-Hernandez et al. |
| 2015/0129290 A1* | 5/2015 | Seong .................. H05K 3/046 174/257 |
| 2015/0130754 A1 | 5/2015 | Yairi et al. |
| 2015/0227230 A1* | 8/2015 | Cok ..................... G06F 3/0443 345/174 |
| 2015/0268724 A1 | 9/2015 | Levesque et al. |
| 2015/0301646 A1* | 10/2015 | Caldwell ............. G06F 3/044 345/174 |
| 2015/0355767 A1* | 12/2015 | Abe ..................... G06F 3/0412 345/174 |
| 2016/0257160 A1 | 9/2016 | Firth et al. |
| 2017/0220161 A1* | 8/2017 | Lee ..................... G06F 3/044 |
| 2017/0256144 A1 | 9/2017 | Khoshkava et al. |
| 2019/0079576 A1* | 3/2019 | Liu ..................... G06F 3/0418 |
| 2019/0079585 A1* | 3/2019 | Bleckmann ........... G06F 3/044 |
| 2019/0079605 A1* | 3/2019 | Wei ..................... G06F 3/041 |

\* cited by examiner

TUNABLE DEVICE INCLUDING TUNABLE MEMBER RESPONSIBLE TO ELECTRIC FIELD APPLIED THERETO, TRANSDUCER INCLUDING THE TUNABLE DEVICE, AND METHOD OF CHANGING ONE OF STIFFNESS AND DAMPING COEFFICIENT OF TUNING THE TUNABLE DEVICE

CROSS-REFERENCE TO RELATED APPLICATION

This application is a continuation-in-part application of U.S. patent application Ser. No. 15/130,476, which is entitled "TUNABLE SENSING DEVICE" and filed on Apr. 15, 2016, and claims priority of Taiwanese Patent Application No. 104134230, filed on Oct. 19, 2015.

FIELD

The disclosure relates to a tunable device, more particularly to a tunable device including a tunable member that is responsible to an electric field applied thereto.

BACKGROUND

A conventional sensing transducer is used for interconversion of physical quantities from one form to another, such as converting an external force into signals, so that interaction between the conventional transducer and an external input can be identified. The conventional transducer may be configured to a sensing device, such as a force sensor, a triaxial accelerometer, a pressure sensor or a speaker, for applying to various fields including robotics, gaming entertainment, biomedical technologies, etc.

Indifferent applications or different environments, requirements for the conventional transducer, such as sensitivity, sensing range or driving range, will be varied. A tactile device is one of the few conventional transducers that are adjustable in the process of manufacturing.

The conventional tactile device frequently employs a dielectric polymer such as polydimethylsiloxane (PDMS) for making a sensing member. However, properties of the dielectric polymer traditionally used in the sensing member is hard to be changed, which causes the tactile devices to have a fixed sensing range. In an attempt to vary the sensing range of the conventional tactile device, adjustment of the degree of crosslinking of PDMS (achieved by changing the proportion of curing agents used in formation of PDMS) is proposed, which gives the sensing member an adjustable stiffness and changes the sensing range of the tactile device. In other words, in case that the sensing range of the conventional tactile device is needed to be changed for a multitasking robotic grapping application, the sensing range of the conventional tactile device is needed to be changed for a multitasking robotic grapping application, the sensing member made of the traditional dielectric polymer must be replaced with one made of a modified dielectric polymer as described above. The replacement of the sensing member leads to reduced flexibility of the conventional tactile devices and the sensing range thereof is still needed to be improved.

Furthermore, properties (e.g., sensitivity) of most of the conventional transducers cannot be adjusted in the manufacturing process or in use after the structural design of the transducers is accomplished. Therefore, the transducers must be remade to cater for different needs, leading to increased manufacturing costs.

SUMMARY

Therefore, an object of the present disclosure is to provide a tunable device that can alleviate the drawback associated with the prior art.

According to a first aspect of the present disclosure, a tunable device includes a deformable dielectric unit and a tunable member. The deformable dielectric unit is formed with a receiving space. The tunable member is received in the receiving space and is responsible to an electric field applied to the tunable member.

According to a second aspect of the present disclosure, a transducer includes at least one of the above tunable device, and one of a driver unit, a sensing unit and the combination thereof in signal transmission with the at least one of the tunable device.

According to a third aspect of the present disclosure, a method of tuning a tunable device is provided, which includes a deformable dielectric unit formed with a receiving space, and an electrode unit including a first electrode and a second electrode that are separately disposed in the deformable dielectric unit, is provided.

The method includes: introducing a tunable member into the receiving space so that the first and second electrodes being respectively disposed at two opposite sides of the tunable member, the tunable member including an insulating fluid and a plurality of dielectric particles that are dispersed in the insulating fluid; and applying an electric field between the first and second electrodes such that the dielectric particles are aligned along the electric field to change a property of the tunable device.

BRIEF DESCRIPTION OF THE DRAWINGS

Other features and advantages of the present disclosure will become apparent in the following detailed description of the embodiment with reference to the accompanying drawings, of which.

DETAILED DESCRIPTION

Figure 1:
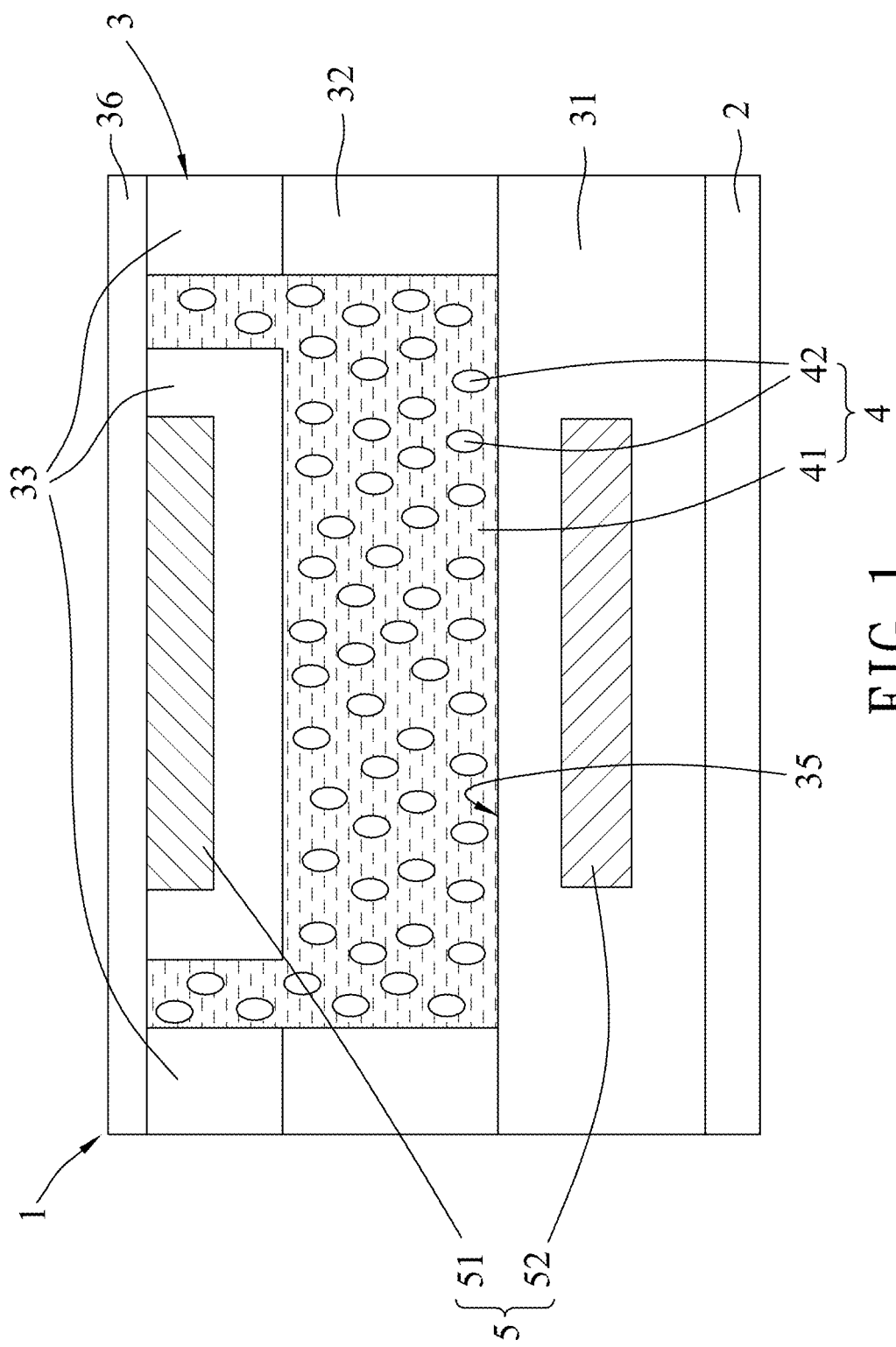
FIG. 1 is a schematic side view of an embodiment of a tunable device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of a tunable device according to the present disclosure includes a substrate 2, a deformable dielectric unit 3, a tunable member 4 and an electrode unit 5.

The deformable dielectric unit 3 is disposed on the substrate 2 and is formed with a receiving space 35, which receives the tunable member 4. In this embodiment, the deformable dielectric unit 3 has a bottom portion 31 that is disposed on the substrate 2, a side portion 32 that peripherally extends from the bottom portion 31 away from the substrate 2, and a top portion 33 that is connected to the side portion 32 and opposite to the bottom portion 31. The bottom portion 31, the side portion 32 and the top portion 33 cooperatively and surroundingly define the receiving space 35. In this embodiment, the receiving space 35 extends through the top portion 33 to form an opening 37 at a surface 331 (see FIG. 2) of the top portion 33 distal to the side portion 32. In this embodiment, the deformable dielectric unit 3 further includes a covering layer 36 that is disposed on the top portion 33 and that covers the opening 37.

The substrate 2 may be made of silicon. The deformable dielectric unit 3 may be made of a dielectric material, such as silicon dioxide ($SiO_2$), silicon nitride ($Si_3N_4$), polydimethylsiloxane (PDMS), etc. Examples of a material suitable for making the covering layer 36 may include, but are not limited to, Parylene C, Parylene D, Parylene N, silicon dioxide, silicon nitride, polyimide, metal, and combinations thereof. In certain embodiments, the substrate 2 may be omitted according to the practical design of the tunable device 1.

The electrode unit 5 includes a first electrode 51 and a second electrode 52, which are disposed in the deformable dielectric unit 3 and are respectively disposed at two opposite sides of the tunable member 4. In this embodiment, the first electrode 51 is disposed in the top portion 33 of the deformable dielectric unit 3, and the second electrode 52 is disposed in the bottom portion 31 of the deformable dielectric unit 3. The covering layer 36 further covers the first electrode 51 to protect the same. The position of the first and second electrodes 51, 52 may be changed as long as the first and second electrodes 51, 52 are respectively disposed at the two opposite sides of the tunable member 4. In other embodiments, the first electrode 51 may be disposed inside the covering layer 36 or on the covering layer 36 opposite to the receiving space 35. In certain embodiments, the top portion 33 of the deformable dielectric unit 3 may be omitted, the covering layer 36 is connected to the side portion 32 and seals the receiving space 35.

The tunable member 4 is responsible to an electric field to change a property of the tunable member 4, which will be elaborated hereinafter.

In this embodiment, the tunable member 4 may be formed as a smart fluid, e.g., an electrorheological fluid (ER-fluid) or a magnetorheological fluid (MR-fluid), and includes an insulating fluid 41 and a plurality of particles 42 dispersed in the insulating fluid 41. The insulating fluid 41 may be silicone oil or mineral oil that have superior corrosion resistance, stability, insulativity (i.e., low electrical conductivity) and non-magnetic, as well as having low permeability. When the tunable member 4 is electrorheological, the particles 42 may be dielectric particles (e.g., silicon dioxide particles, barium titanate particles or starch particles) that can be polarized by the electric field, and thus aligned therein for changing the property of the tunable member 4, such as increasing the stiffness of the tunable member 4. When the tunable member 4 is magnetorheological, the particles 42 may be magnetic particles (e.g., iron powders) that can be polarized by an external magnetic field, and thus align therealong for changing the property of the tunable member 4, such as increasing the stiffness of the tunable member 4. In this embodiment, the particles 42 have a particle size smaller than 100 μm, which facilitates alignment of the particles 42 in the insulating fluid 41 in response to the applied electric field. Specifically, when the particle size of the particles 42 is smaller than 100 μm, the particles 42 will have a larger specific surface area for interacting with the insulating fluid 41 so as to contribute to adjustment of shear modulus and viscosity of the tunable member 4.

Figure 2:
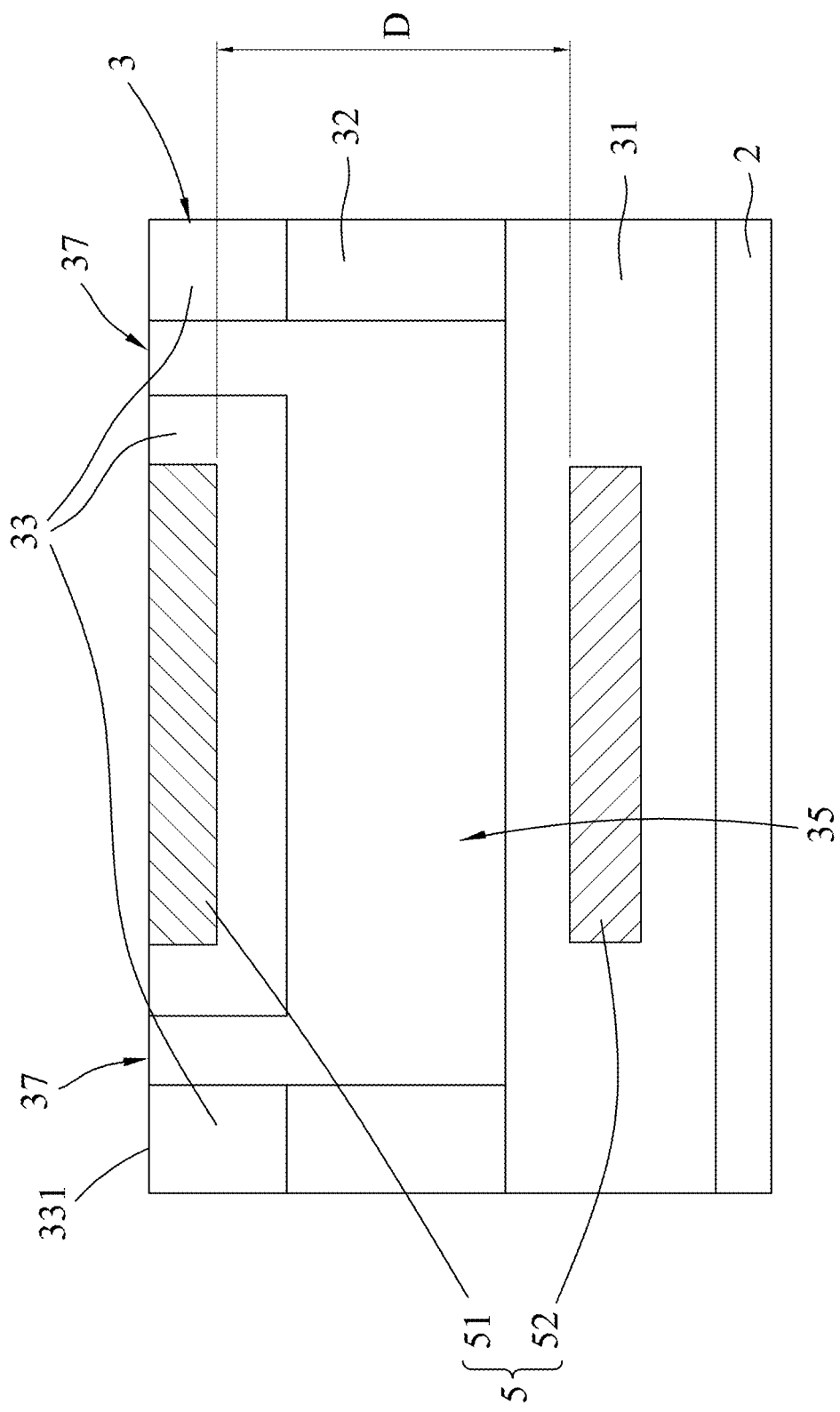
FIG. 2 is a schematic side view of the embodiment, with a tunable member and a covering layer of the embodiment omitted.

Referring further to FIG. 2, when manufacturing the tunable device 1, the bottom portion 31 of the deformable dielectric unit 3 is formed on the substrate 2 and the second electrode 52 is formed in the bottom portion 31, followed by forming the side portion 32 on the bottom portion 31 and forming the top portion 33 on the side portion 32 with the first electrode 51 formed in the top portion 33. Afterwards, the top portion 33 and the side portion 32 are partially removed to form the receiving space 35. The tunable member 4 is then introduced into the receiving space 35 through the openings 37 (see FIG. 1), followed by forming the covering layer 36 on the top portion 33 to cover the openings 37 and to seal the tunable member 4 in the receiving space 35 (see FIG. 1). It should be noted that the number, shape and location of the openings 37 may be changed according to practical requirements.

Figure 3:
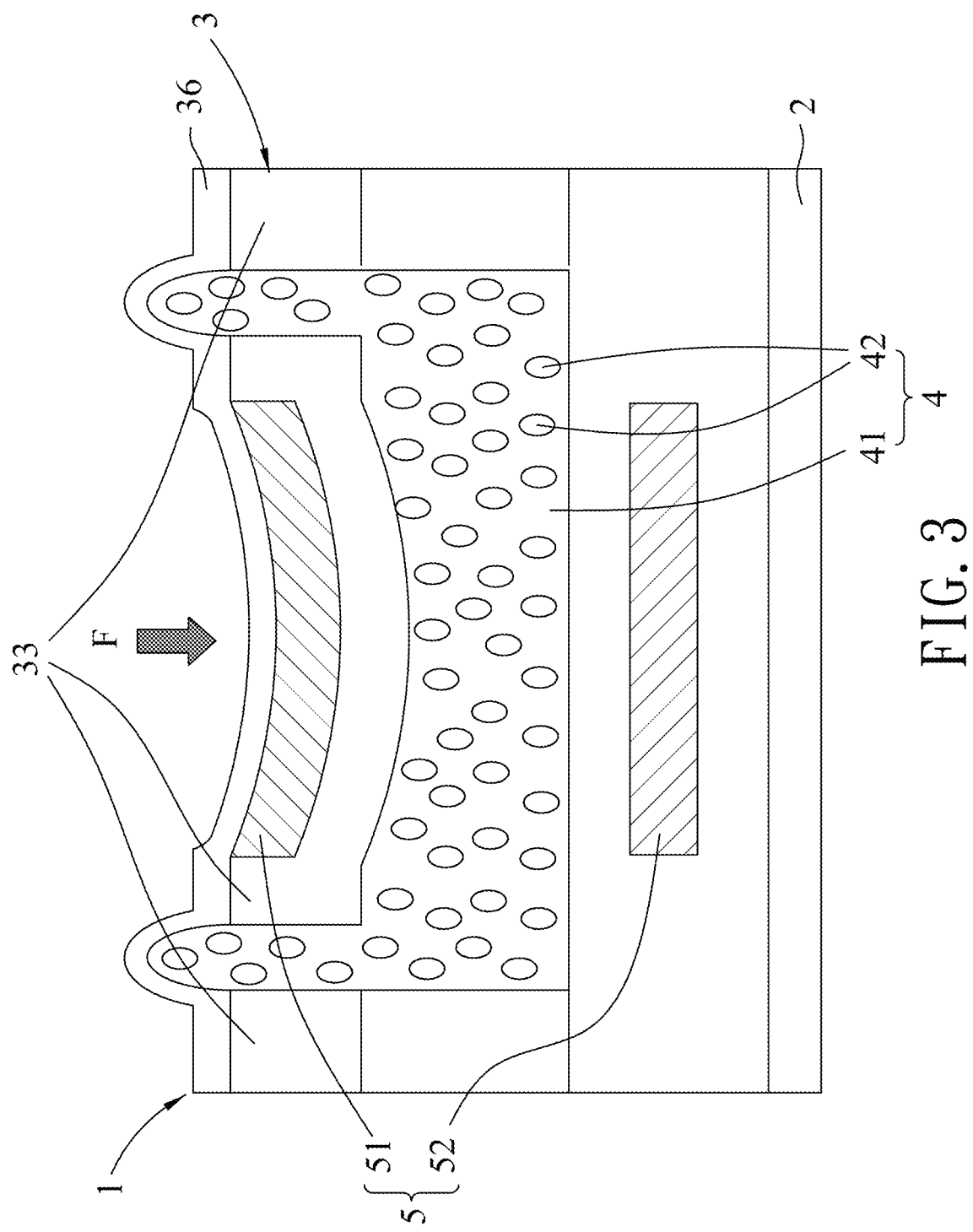
FIG. 3 is a schematic side view showing an external force is applied to the embodiment.

Referring to FIG. 3, when in use, a physical input (e.g., an external force (F)) may be applied to the covering layer 36 of the deformable dielectric unit 3, causing the first electrode 51 and at least a part of the top portion 33 to be deformed so as to deform the tunable member 4. A signal change between the first and second electrodes 51, 52 which results from a change of a minimum distance (D) therebetween (see FIG. 2) is measured. It should be noted that the physical input can be different kinds of input depending on practical applications of the tunable device 1. When the tunable device 1 is used in a tactile sensor, the physical input may be a pressing force. When the tunable device 1 is used in an accelerometer, the physical input may be the force applied to the tunable device 1 due to movement of the accelerometer. When the tunable device 1 is used in a thermocouple, the physical input may be a force applied to the tunable device 1 caused by temperature change.

In certain embodiments, the first and second electrodes 51, 52 and the tunable member 4 may be assembled as is a capacitor, and the tunable device 1 is used as a capacitive tactile sensor. When the first electrode 51 and the tunable member 4 are deformed, the minimum distance (D) between the first and second electrodes 51, 52 is changed, and therefore a capacitance change (i.e., the signal change) can be measured between the first and second electrodes 51, 52. It should be noted that the type of signal associated with the external force (F) applied to the tunable device 1 may be a signal other than capacitance, such as resistance, optical property, etc.

It is known that capacitance is inversely proportional to the distance between the first and second electrodes 51, 52. When a larger amount of the external force (F) is applied, the first electrode 51 is squeezed further toward the second electrode 52 and deformation of the tunable member 4 is increased, resulting in a larger capacitance between the first and second electrodes 51, 52. When the external force (F) exceeds the deformation limit of the tunable member 4, the tunable member 4 is no longer capable of being deformed, and thus a maximum capacitance value (i.e., saturation capacitance) is measured between the first and second electrodes 51, 52. In such case, capacitance greater than the saturation capacitance cannot be measured.

Figure 4:
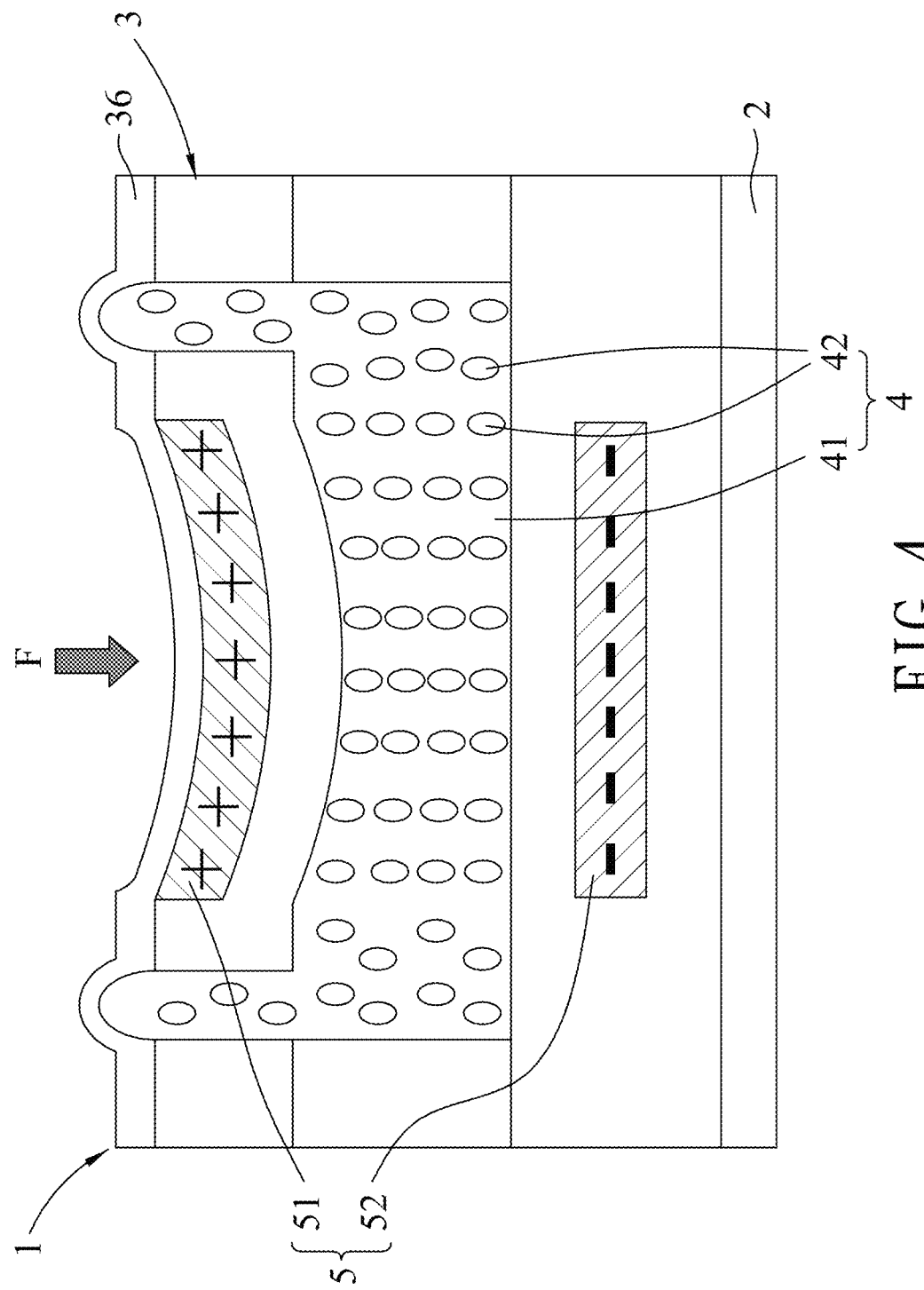
FIG. 4 is a schematic side view showing the external force and an electric field are applied to the embodiment.

Referring to FIG. 4, when the tunable member 4 is exemplified to be the ER-fluid, capacitance greater than the saturation capacitance can be measured by applying the electric field to the tunable member 4 so as to adjust the alignment of the particles 42 in the insulating fluid 41. Specifically, in certain embodiments, the first electrode 51 is positively charged, and the second electrode 52 is negatively charged in response to a DC voltage applied to the first and second electrodes 51, 52. The particles 42 of the tunable member 4 are polarized to align along the electric field, thereby increasing the stiffness of the tunable member 4 and the overall stiffness of the tunable device 1. Therefore, a larger amount of the external force (F) can be applied to the tunable device 1 and a greater capacitance can be measured. In other words, a maximum capacitance value measured between the first and second electrodes 51, 52 when the tunable member 4 is applied with the electric field induced by the DC voltage is different from (e.g., larger than) a maximum capacitance value measured between the first and second electrodes 51, 52 when the tunable member 4 is not applied with the electric field. In this embodiment, the minimum distance (D) between the first and second electrodes 51, 52 (see FIG. 2) is less than 3 mm, so as to allow a reasonable amount of electric field, such as an electric field ranging from 0.5 kV/mm to 50 kV/mm, which is generated with a voltage less than 500 V. If the minimum distance (D) between the first and second electrodes 51, 52 is too large (e.g., larger than 3 mm), a large voltage is needed to generate an electric field that is capable for aligning the particles 42 in the insulating fluid 41.

Figure 5:
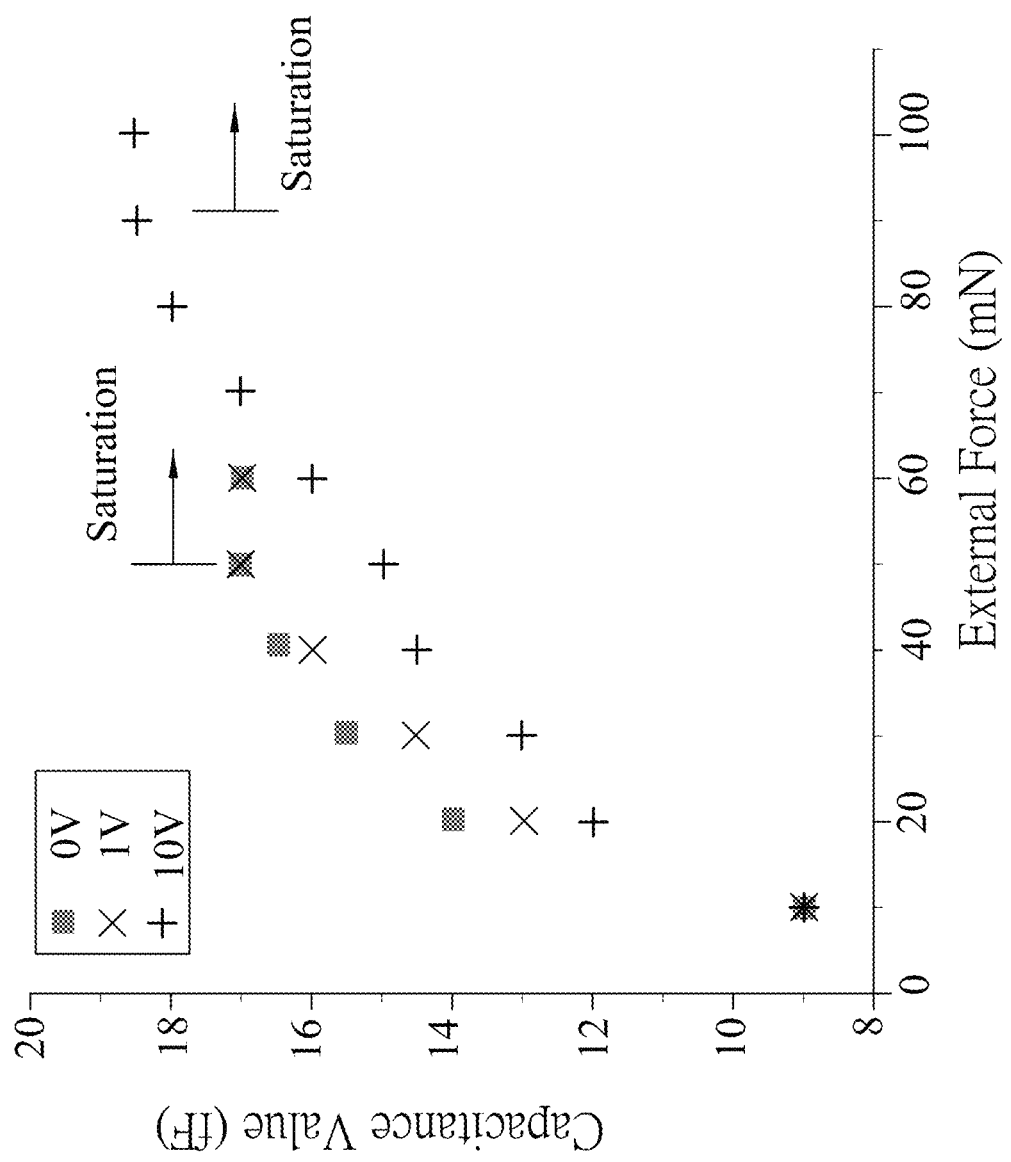
FIG. 5 is a plot showing capacitance values of the embodiment versus values of the external force under different electric fields.

FIG. 5 is a diagram showing the external force (F) applied to the tunable device 1 (see FIG. 4) versus capacitance values measured between the first and second electrodes 51, 52 when no voltage is applied (i.e., 0V) and when the DC voltage (i.e., 1V and 10V) is applied to the first and second electrodes 51, 52. When no DC voltage is applied to the tunable member 4 or a smaller DC voltage (1V) is applied to the first and second electrodes 51, 52, saturation capacitance is reached at an external force (F) of around 50 mN. In other words, sensitivity of the tunable device 1 is in a range of 0 to 50 mN. When a larger DC voltage (10V) is applied to the t first and second electrodes 51, 52, saturation capacitance is reached at an external force (F) of around 90 mN. That is, the sensitivity of the tunable device 1 is increased up to 90 mN.

It should be particularly pointed out that the signal measuring mechanism of this disclosure may be changed according to practical requirements.

FIG. 6A illustrates schematically the arrangement of the particles 42 in the insulating fluid 41 in response to different amounts of the electric field induced by different amounts of the DC voltages. The DC voltages inducing the electric fields are denoted as $V_{DC1}$ and $V_{DC2}$ in FIG. 6A, in which $V_{DC2}$ is higher than $V_{DC1}$. Referring to the middle portion of FIG. 6A, with the higher DC voltage ($V_{DC2}$) (i.e., greater induced electric field), the particles 42 are aligned more densely along the electric field, leading to larger overall stiffness of the tunable device 1. Therefore, referring to the top portion of FIG. 6A, when the tunable device 1 (see FIG. 1) is used in one type of transducer (e.g., an accelerometer), the displacement of the first electrode 51 (see FIG. 3) is smaller for $V_{DC2}$, compared to $V_{DC1}$, under the same acceleration of the transducer. This indicates the sensitivity and sensing range of sensor are modified. In other words, an operating frequency, or an operating frequency range of the transducer can be changed by adjusting the tunable device 1 included therein. Referring to the bottom portion of FIG. 6A, the resonant frequencies ($f_1$ and $f_2$) of the tunable device 1 can be changed through applying different electric field ($V_{DC1}$ and $V_{DC2}$) based on different applications, leading to stiffness variation. For example, when the transducer is a scanning mirror, the change of resonant frequency can lead to different display frequency; when the transducer is a gyroscope, the change of resonant frequency can lead to different sampling frequency.

FIG. 6B illustrates schematically the arrangement of the particles 42 in the insulating fluid 41 in response to different amounts of the electric field induced by different amounts of the AC voltages. The AC voltages inducing the electric fields are denoted as $V_{AC1}$ and $V_{AC2}$ in FIG. 6B. As can be seen from the middle portion of FIG. 6B, different AC voltages ($V_{AC1}$ and $V_{AC2}$) result in different arrangements of the particles 42 in the insulating fluid 41. Under the electric fields induced by $V_{AC1}$ and $V_{AC2}$, multiple particles 42 are agglomerated into a larger particle lump, which changes the flow resistance of the particles 42 to the insulating fluid 41, thereby changing the damping of the tunable device 1 (see FIG. 1). Referring to the top portion of FIG. 6B, when the tunable device 1 is used in another type of transducer (e.g., a MEMS speaker), although the values of stiffness of the tunable device 1 applied with different AC electric fields are close (see the top portion of FIG. 6B, in which a gap between the displacements of the first electrode 51 (see FIG. 3) with $V_{AC1}$ and $V_{AC2}$ are relatively small under the same external force) under the same speaker driving voltage, the bandwidths of the tunable device 1 in response to different AC electric fields are different (see the bottom portion of FIG. 6B). Specifically, $V_{AC2}$ gives the tunable device 1 a larger bandwidth, in which the displacement vales are similar to each other across various frequencies. This property is desirable in applications like MEMS speakers, microphones, etc. Moreover, as shown in the bottom portion of FIG. 6B, since the displacement measured from the tunable device 1 applied with $V_{AC2}$ is smaller than the displacement measured from the tunable device 1 applied with $V_{AC1}$ in terms of different device frequency, the damping of the tunable device 1 applied with $V_{AC2}$ is larger than the damping of the tunable device 1 applied with $V_{AC1}$. Therefore, the types of electric field applied to the tunable device 1 can be chosen based on different applications of the tunable device 1.

Referring back to FIG. 1, in certain embodiments, the insulating fluid 41 may be made of a curable material, such as a thermo-curable polymer or a photo-curable polymer, so as to increase a stiffness of the insulating fluid 41 through curing. The thermo-curable polymer is curable by heat. The photo-curable polymer is curable by light, such as ultraviolet light. In other embodiments, the insulating fluid 41 may be cured by adding curing agent, such as epoxy adhesive. It should be noted that the insulating fluid 41 may be fully cured to fix the particles 42 therein, and the covering layer 36 may be omitted. Alternatively, the insulating fluid 41 may be partially cured and still allows the particles 42 to move therein.

Figure 7:
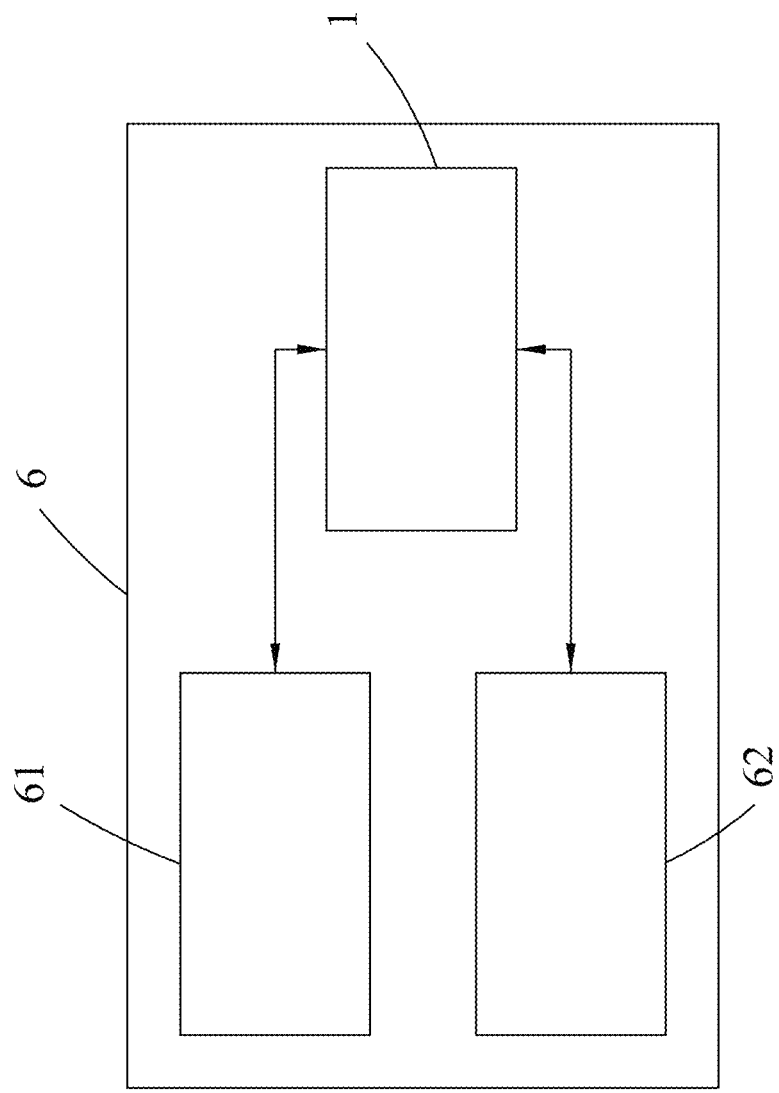
FIG. 7 is a block diagram of an embodiment of a transducer according to the present disclosure.

Referring to FIG. 7, an embodiment of a transducer 6 of this disclosure is provided. The transducer 6 includes at least one of the above-disclosed tunable device 1 (see FIG. 1), and a combination of a driver unit 61 and a sensing unit 62 in signal transmission with the tunable device 1. It should be noted that one of the driver unit 61 and a sensing unit 62 may be omitted according to practical requirements.

The transducer 6 may be a sensor or an actuator. Specifically, the transducer 6 may be an accelerometer, a pressure sensor, a speaker, or the like. When the transducer 6 is the sensor, the sensing unit 62 is operable to sense deformation of the tunable device 1, and when the transducer 6 is the actuator, the driver unit 61 is operable to actuate the tunable device 1.

Figure 8:
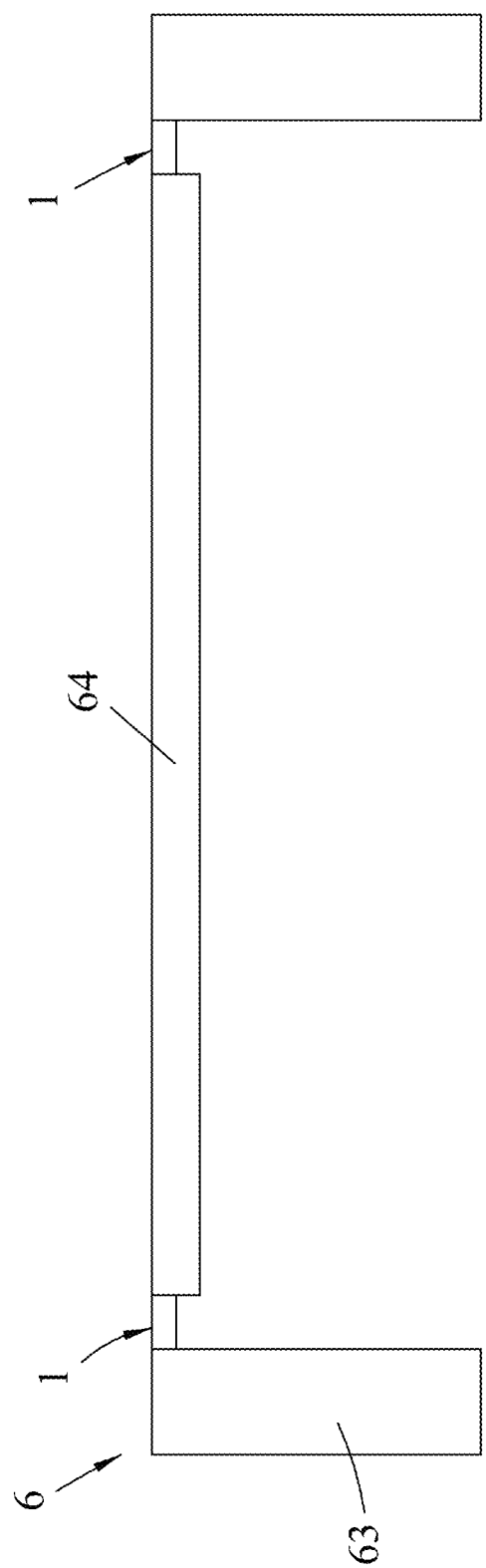
FIG. 8 is a schematic side view of the embodiment of the transducer.

Referring further to FIG. 8, in this embodiment, the transducer 6 is exemplified as a MEMS speaker, and further includes a substrate 63 and a flexible diaphragm 64. In this embodiment, the substrate 63 is made of silicon, the flexible diaphragm 64 is made of a silicon-based material, a silicon nitride-based material, a piezoelectric material etc., and the substrate 2 (see FIG. 1) of the tunable device 1 is made of a piezoelectric material.

The flexible diaphragm 64 is connected to the substrate 63 through at least one of the tunable device 1. Two of the tunable devices 1 are schematically shown in FIG. 8, and it should be noted that the number of the tunable device(s) 1 may be changed according to practical applications. In use, the driver unit 61 is operable to transmit electric signals to the substrate 2 of the tunable device 1, causing the combination of the tunable device 1 and the flexible diaphragm 64 to vibrate so as to generate sound. Referring to FIGS. 1 and 8, properties of the tunable devices 1 may be tuned as abovementioned, including applying DC or AC voltage to the first and second electrodes 51, 52 to change alignment of the particles 42 in the insulating fluid 41, and/or curing the insulating fluid 41 to change stiffness of the tunable member 4 and to change the mobility of the particles 42 in the insulating fluid 41, which may change the vibration amplitude, or bandwidth of the flexible diaphragm 64.

Figure 9:
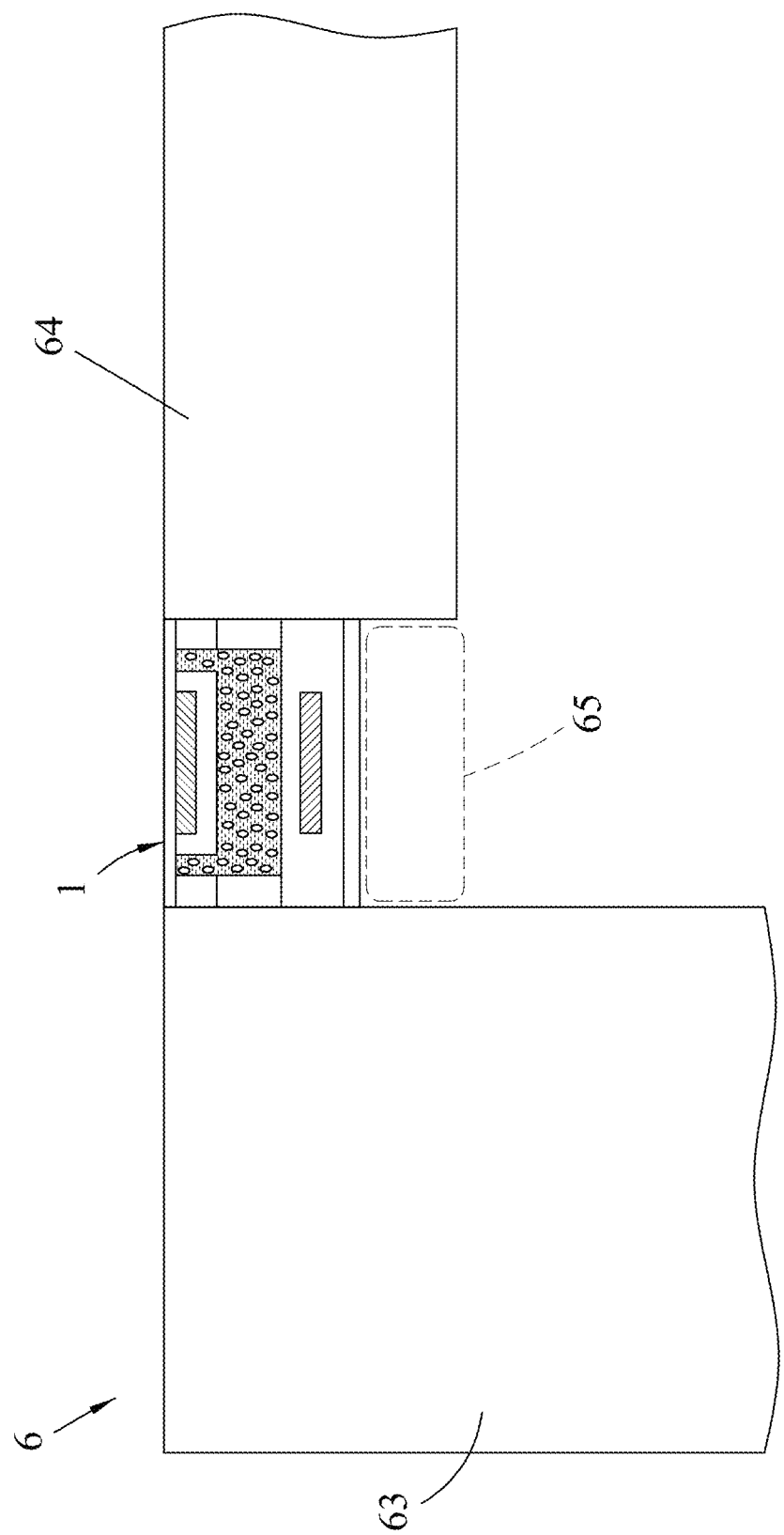
FIG. 9 is a fragmentary and schematic side view of the embodiment of the transducer.

Referring to FIGS. 8 and 9, in this embodiment, the transducer 6 further includes an accommodating space 65 that is configured to receive the tunable device 1 when the tunable device 1 is deformed by a force (e.g., the external force (F) shown in FIGS. 3 and 4). In this embodiment, when the tunable device 1 is deformed with the vibration of the flexible diaphragm 64, the accommodating space 65 serves to accommodate the deformed tunable device 1. It should be noted that the number and location of the accommodating space 65 may be changed according to practical requirements. It should be noted that the orientation of the tunable device 1 should not be limited to what is shown in FIG. 9, and may be changed according to desired vibration mode of the flexible diaphragm 64 and the entire design or purpose of the transducer 6.

Figure 6:
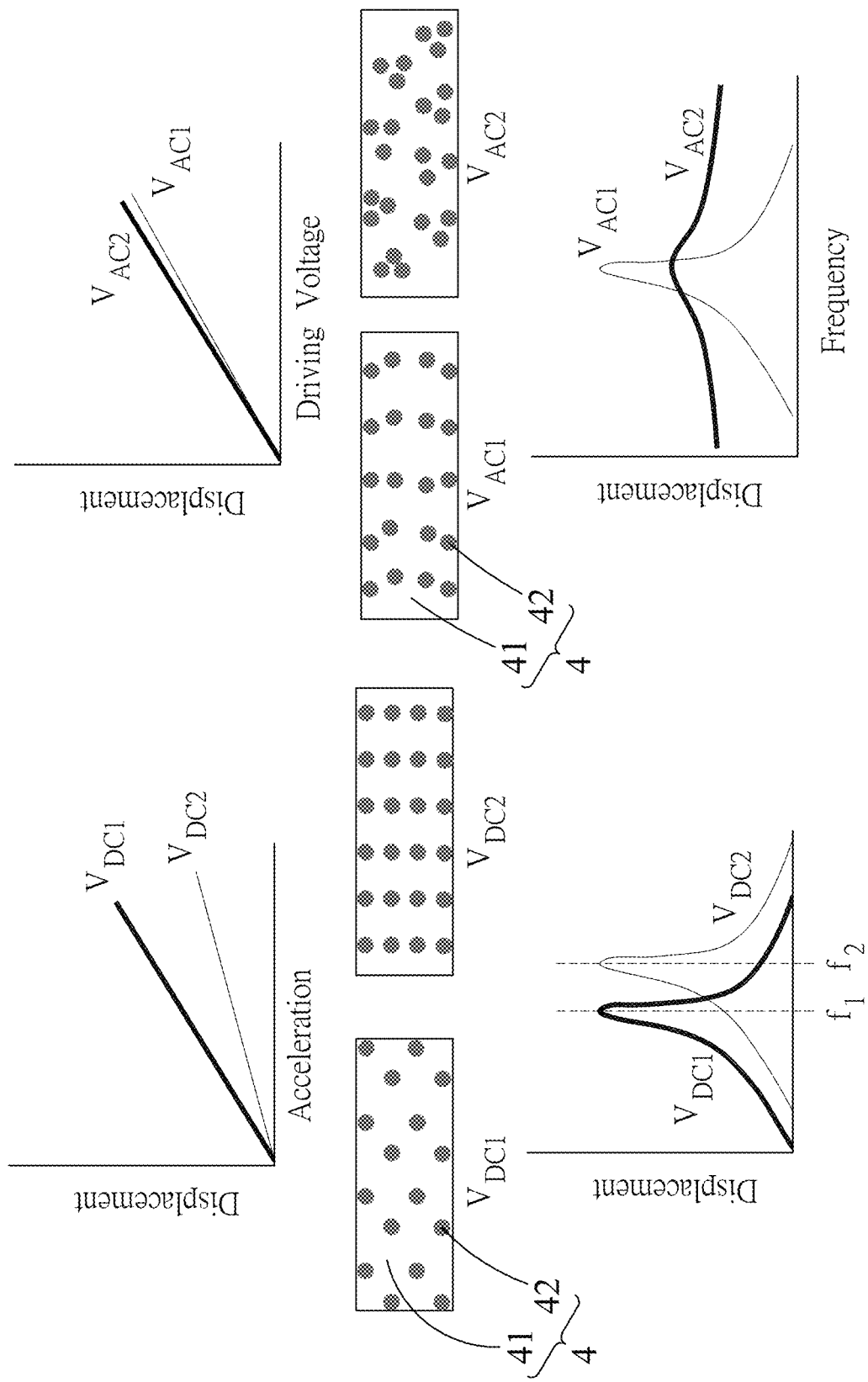
FIG. 6A is a combination of plots, schematically illustrating an arrangement of particles in an insulating fluid of the embodiment when a DC voltage is applied thereto.
FIG. 6B is a combination of plots, schematically illustrating an arrangement of particles in an insulating fluid of the embodiment when an AC voltage is applied thereto.
Figure 10:
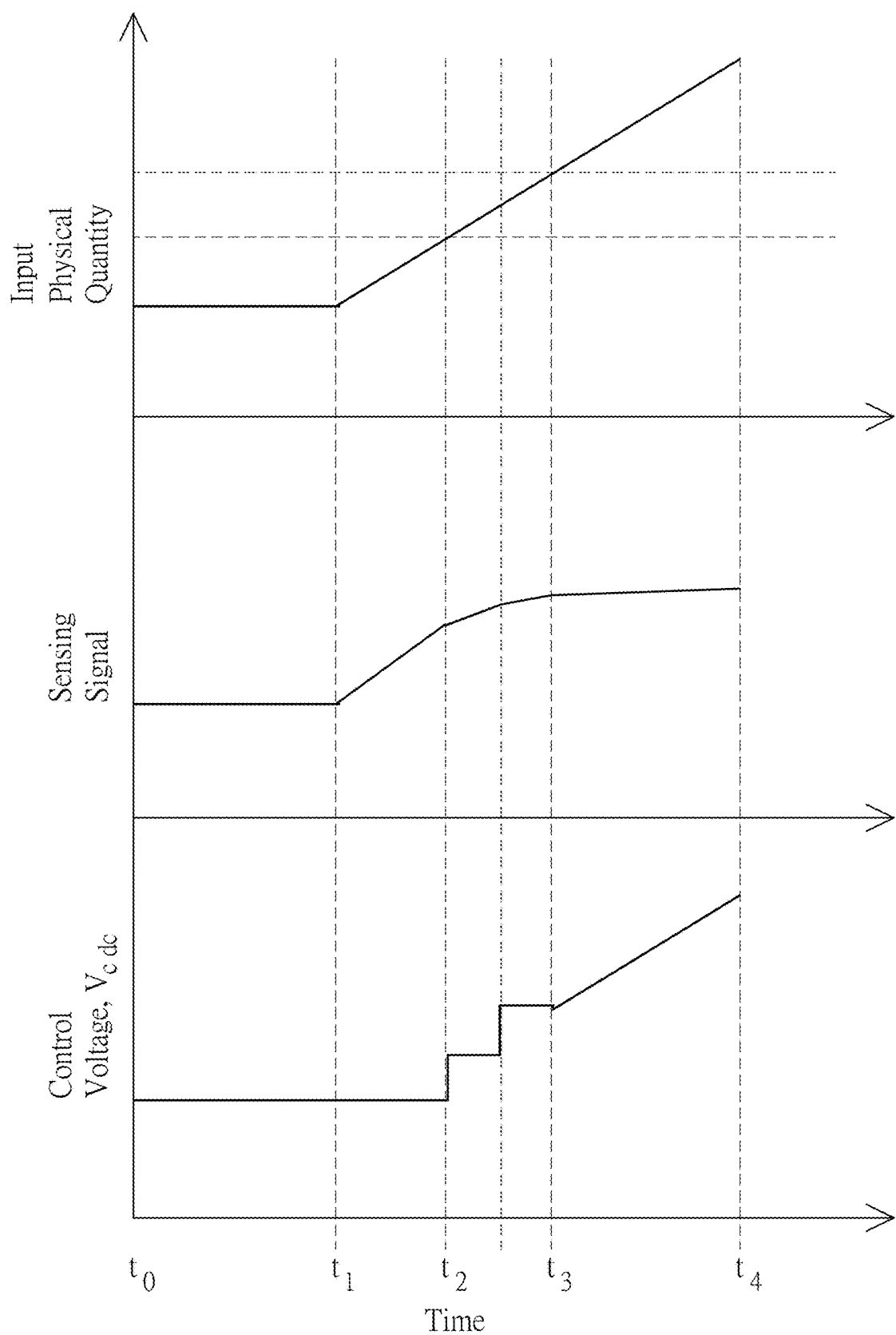
FIG. 10 is a plot showing an operational example of the transducer.

Referring to FIGS. 1, 6 and 10, an operational example of operating the transducer 6 is provided. In this example, the transducer 6 is a tactile sensor, the input physical quantity in FIG. 10 is the external force (F) applied to the tunable device 1 resulting in capacitance change of the tunable device 1, the sensing signal is the capacitance measured between the first and second electrodes 51, 52, and the control voltage in FIG. 10 is the DC voltage used for changing the arrangement of the particles 42 and changing the stiffness of the tunable member 4. During $t_0$ to $t_1$, a certain amount of control voltage may be applied to the tunable device 1 to change the stiffness of the tunable device 1, the input physical quantity is a constant value, and the sensing signal is therefore also a constant value. During $t_1$ to $t_2$, the input physical quantity is increased, and the sensing signal is therefore also increased. During $t_2$ to $t_3$, the control voltage is increased twice with the input physical quantity continues to increase in a linear manner, during which the sensing signal is changed with two rates (see the sensing signal is changed in two different slopes in FIG. 10 during $t_2$ to $t_3$) in response to the two control voltage changes. During $t_3$ to $t_4$, the sensing signal is almost the same with the increase of the control voltage and the input physical quantity, which means the tunable device 1 reaches its threshold capacity (i.e., maximum measuring capacity). With the increase of the control voltage, the transducer 6 is still capable of measuring the sensing signal beyond its threshold capacity. It should be noted that FIG. 10 is only an exemplary example showing the operation of the transducer 6. It should not be construed as limiting the transducer 6 to the tactile sensor and limiting the operation of the transducer 6 to the above described manner.

Figure 11:
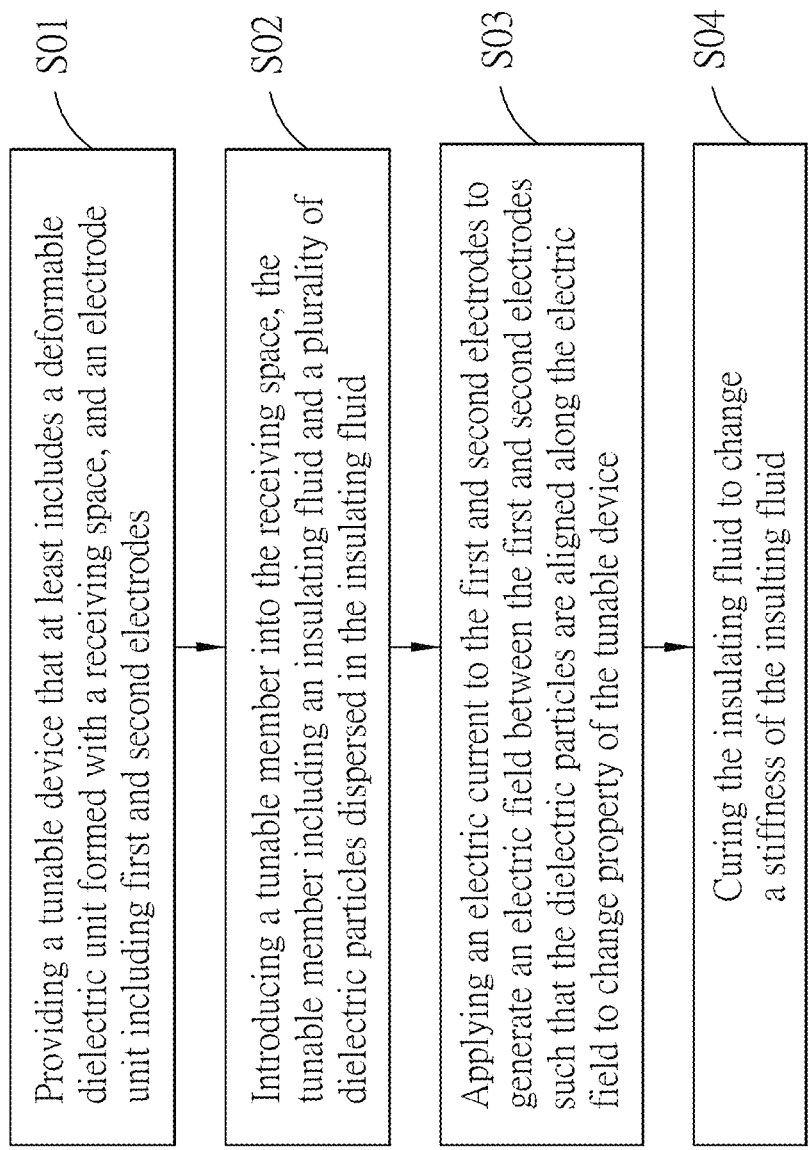
FIG. 11 is a flow chart of an embodiment of a method of tuning a tunable device according to the present disclosure.

Referring back to FIGS. 1 and 2 in combination with FIG. 11, the present disclosure also provides an embodiment of a method of tuning the property of the tunable device 1 that includes steps S01 to S04.

In step S01, a pre-form of the tunable device 1, which is without the tunable member 4 and has a structure shown in FIG. 2, is provided.

In step S02, the tunable member 4 is introduced into the receiving space 35 through the openings 37, followed by covering the openings 37 with the covering layer 36.

In step S03, an electric voltage is applied to the first and second electrodes 51, 52 to generate the electric field between the first and second electrodes 51, 52, such that the dielectric particles 42 are aligned along the electric field to change the property of the tunable device 1. The electric voltage may be the DC voltage or AC voltage above.

In step S04, the insulating fluid 41 is cured to change the stiffness of the insulating fluid 41. The curing of the insulating fluid 41 is elaborated as above and is not repeated for the sake of brevity.

It should be particularly pointed out that the insulating fluid 41 may be cured before changing the alignment of the dielectric particles 42 by applying a voltage to the first and second electrodes 51, 52 (i.e., the step S03). Alternatively, besides curing the insulating fluid 41 before step S03, the insulating fluid 41 may be further cured after S03. In other words, the order of the curing of the insulating fluid 41 and the alignment of the dielectric particles 42 may be changed according to practical requirements, and is not limited to what is shown in FIG. 11.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method of tuning a tunable device, the tunable device including a deformable dielectric unit formed with a receiving space, and an electrode unit including a first electrode and a second electrode that are separately disposed in the deformable dielectric unit, the method comprising:

introducing a tunable member into the receiving space so that the first and second electrodes being respectively disposed at two opposite sides of the tunable member, the tunable member including an insulating fluid and a plurality of dielectric particles that are dispersed in the insulating fluid; and applying an electric field between the first and second electrodes such that the dielectric particles are aligned along the electric field to change one of stiffness and damping coefficient of the tunable device, the electric field being induced by one of a DC voltage applied to the first and second electrodes for changing stiffness of the tunable member, an AC voltage applied to the first and second electrodes for changing damping coefficient of the tunable member, and a combination of the DC voltage and the AC voltage for changing the stiffness and the damping coefficient of the tunable member.

2. The method as claimed in claim 1, wherein the receiving space extends through and forms an opening at a surface of a top portion of the deformable dielectric unit, the tunable member being introduced into the receiving space through the opening of the deformable dielectric unit.

3. The method as claimed in claim 1, wherein the insulating fluid of the tunable member is made of a curable polymer, and wherein the method further comprising curing the insulating fluid to change a stiffness of the insulating fluid.

4. The method as claimed in claim 3, wherein the curable polymer is selected from a thermo-curable polymer and a photo-curable polymer.

5. The method as claimed in claim 1, wherein the dielectric particles of the tunable member are made of one of silicon dioxide, barium titanate and starch.

6. The method as claimed in claim 1, wherein the particle size of each of the dielectric particles of the tunable member is smaller than 100 µm.

7. The method as claimed in claim 1, wherein the insulating fluid further includes a curing agent.

8. The method as claimed in claim 1, wherein a minimum distance between the first and second electrodes is less than 3 mm.

9. The method as claimed in claim 1, wherein:

the deformable dielectric unit has a bottom portion, a side portion peripherally extending from the bottom portion, and a top portion connected to the side portion and opposite to the bottom portion;

the bottom portion, the side portion and the top portion cooperatively and surroundingly define the receiving space, the receiving space extending through the top portion to form an opening at a surface of the top portion that is distal to the side portion; and the first electrode is disposed in the top portion and the second electrode is disposed in the bottom portion.

* * * * *